United States Patent
Kim et al.

(10) Patent No.: US 8,053,308 B2
(45) Date of Patent: Nov. 8, 2011

(54) METHOD OF FORMING A PATTERN AND METHOD OF MANUFACTURING A CAPACITOR

(75) Inventors: Kyoung-Min Kim, Gyeonggi-do (KR); Jae-Ho Kim, Gyeonggi-do (KR); Young-Ho Kim, Gyeonggi-do (KR); Myung-Sun Kim, Daegu (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1015 days.

(21) Appl. No.: 11/945,934

(22) Filed: Nov. 27, 2007

(65) Prior Publication Data

US 2008/0121609 A1 May 29, 2008

(30) Foreign Application Priority Data

Nov. 27, 2006 (KR) .................. 10-2006-0117680

(51) Int. Cl.
*H01L 21/8242* (2006.01)
(52) U.S. Cl. ......... 438/239; 438/254; 438/396; 438/397
(58) Field of Classification Search .................. 438/239, 438/253, 254, 396, 397
See application file for complete search history.

(56) References Cited

U.S. PATENT DOCUMENTS

| | | | | |
|---|---|---|---|---|
| 5,061,601 A | * | 10/1991 | West et al. | 430/278.1 |
| 5,843,319 A | * | 12/1998 | Przybilla et al. | 210/668 |
| 6,136,643 A | * | 10/2000 | Jeng et al. | 438/253 |
| 6,315,912 B1 | * | 11/2001 | Koshitaka et al. | 216/6 |
| 7,122,424 B2 | * | 10/2006 | Tu et al. | 438/253 |
| 7,288,585 B2 | * | 10/2007 | Moad et al. | 524/315 |
| 2002/0177069 A1 | * | 11/2002 | Jung et al. | 430/270.1 |
| 2006/0160021 A1 | * | 7/2006 | Kim et al. | 430/270.1 |

FOREIGN PATENT DOCUMENTS

| | | |
|---|---|---|
| KR | 2001-0056943 | 7/2001 |
| KR | 2004-0046704 | 6/2004 |
| KR | 2006-0059443 | 6/2006 |

OTHER PUBLICATIONS

English language abstract of Korean Publication No. 2001-0056943.
English language abstract of Korean Publication No. 2004-0046704.
English language abstract of Korean Publication No. 2006-0059443.

* cited by examiner

*Primary Examiner* — Charles Garber
*Assistant Examiner* — Bryan Junge
(74) *Attorney, Agent, or Firm* — Harness, Dickey & Pierce, P.L.C.

(57) ABSTRACT

In a method of forming a pattern, a mold layer having an opening is formed on a substrate. A conductive layer is formed on the mold layer having the opening, the conductive layer having a substantially uniform thickness. A buffer layer pattern is formed in the opening having the conductive layer, the buffer layer pattern having a cross-linked structure of water-soluble copolymers including a repeating unit of N-vinyl-2-pyrrolidone and a repeating unit of acrylate. An upper portion of the conductive layer exposed over the buffer layer pattern is etched. Accordingly, a conductive pattern for a semiconductor device is formed on the substrate. The method of forming a pattern may simplify manufacturing processes for a capacitor and a semiconductor device, and may improve their efficiencies.

18 Claims, 13 Drawing Sheets

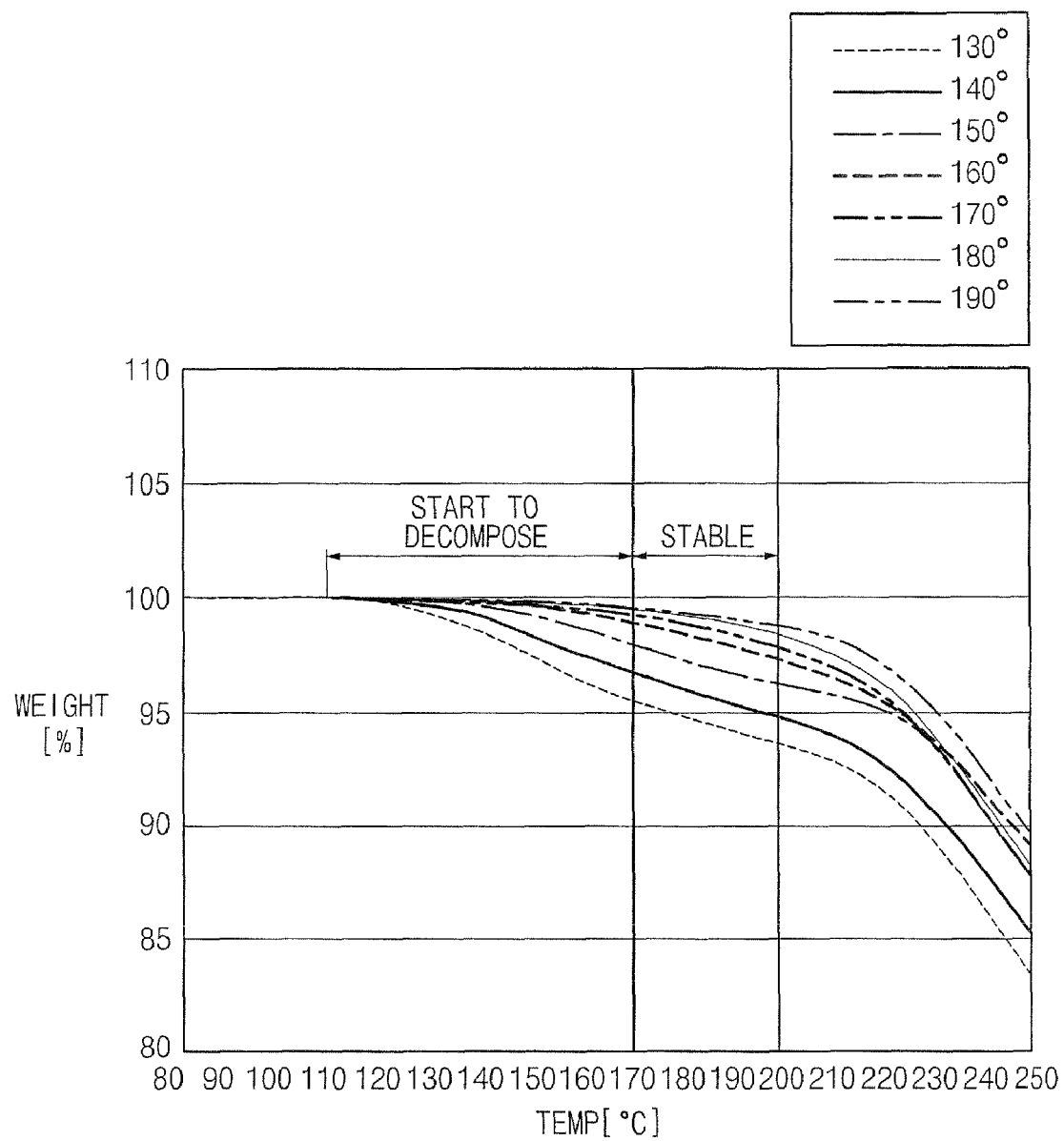

METHOD OF FORMING A PATTERN AND METHOD OF MANUFACTURING A CAPACITOR

CROSS-REFERENCE TO RELATED APPLICATIONS

This application claims priority under 35 U.S.C. §119 to Korean Patent Application No. 2006-117680, filed on Nov. 27, 2006 in the Korean Intellectual Property Office (KIPO), the contents of which are herein incorporated by reference in their entirety.

BACKGROUND OF THE INVENTION

1. Field of the Invention

Example embodiments of the present invention relate to a method of forming a pattern and a method of manufacturing a capacitor using the same. More particularly, example embodiments of the present invention relate to a method of forming a conductive pattern using a buffer layer pattern and a method of manufacturing a capacitor using the method of forming a conductive pattern.

2. Description of the Related Art

Generally, a capacitor employed in an electronic device, for example, a dynamic random access memory (DRAM) device, includes a lower electrode, a dielectric layer, and an upper electrode. In order to improve a capacitance of a memory device having the capacitor, it is important to improve an electric capacitance of the capacitor.

Recently, an area of a unit cell of the DRAM device has been reduced as integration of the DRAM device has been increased to have a giga-size. Thus, the capacitor having a flat shape has been manufactured so as to have a great capacitance. However, the shape of the capacitor has been gradually changed into a box shape or a cylindrical shape in order to have a relatively higher aspect ratio.

The cylindrical capacitor includes a lower electrode having a cylindrical shape. A buffer layer pattern may be used in a node-separation process for forming the lower electrode having the cylindrical shape, and examples of a material that may be used for the buffer layer pattern may include an oxide, a photosensitive material, etc.

In order to form a buffer layer pattern including an oxide, the buffer oxide layer is formed through an oxide deposition process, and then the buffer oxide layer is etched through an etch-back process or chemical mechanical polishing process. Accordingly, the process of forming the butter layer pattern requires a relatively long duration of time for the deposition process and the etching process. Additionally, a void may be formed in the buffer layer pattern. An atomic layer deposition process is employed to form a buffer layer pattern without the void.

In order to form the buffer layer pattern including the photosensitive material, a photoresist film is formed. Thereafter, an exposing process, a developing process using a developing solution, a cleaning process, and a baking process are sequentially performed on the photoresist film. Thus, high cost exposure devices are needed for forming the buffer layer pattern. Furthermore, a baking process hardening the photoresist film at a temperature higher than about 270° C. is essentially needed. The photoresist film hardened through the high temperature baking process may not be easily removed through a plasma ashing process.

The lower electrode of the buffer layer pattern may be damaged while the ashing process and the cleaning process are performed. Furthermore, the buffer layer pattern is not easily removed by a conventional ashing process, and a residue of the buffer layer pattern remaining in an opening may serve as a resistance to cause malfunction of the capacitor. In order to improve an efficiency of the ashing process for removing the buffer layer pattern, an oxygen plasma ashing process may be performed at a high temperature of about 150° C. to about 250° C. However, the high temperature ashing process may deteriorate and/or oxidize the lower electrode so that the capacitor does not have a desired electric capacitance.

SUMMARY OF THE INVENTION

Example embodiments of the present invention provide a method of forming a pattern of a semiconductor device using a buffer layer including a copolymer having a repeating unit of N-vinyl-2-pyrrolidone and a repeating unit of acrylate.

Example embodiments of the present invention also provide a method of manufacturing a capacitor of a semiconductor device using the buffer layer including the copolymer.

According to one aspect of the present invention, there is provided a method of forming a pattern. The method comprises forming a mold layer having an opening on the substrate. A conductive layer is formed on the mold layer and in the opening. The conductive layer has a substantially uniform thickness. A buffer layer pattern is formed to fill the opening having the conductive layer. The buffer layer pattern has a cross-linked structure of water-soluble copolymers including a repeating unit of N-vinyl-2-pyrrolidone and a repeating unit of an acrylate. An upper portion of the conductive layer exposed over the buffer layer pattern is then etched to form said conductive pattern on the substrate.

In one embodiment, the water-soluble copolymer has a number average molecular weight of about 7,000 to about 15,000. In another embodiment, the water-soluble copolymer includes about 25% to about 35% by mole of the repeating unit of acrylate and about 65% to about 75% by mole of the repeating unit of N-vinyl-2-pyrrolidone. In a further embodiment, the water-soluble copolymer is represented by following Chemical Formula 1, and wherein R is an alkyl group having from 1 to 5 carbon atoms or a methyl adamantyl group, and a ratio of y:x which is from about 1:1.8 to about 1:3.

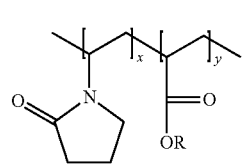

<Chemical Formula 1>

In a still a further embodiment, a buffer layer pattern is formed. This formation method comprises forming a preliminary buffer layer filling the opening having the conductive layer, the preliminary buffer layer covering the conductive layer on the mold layer, removing an upper portion of the preliminary buffer layer by using an aqueous solution, and curing the preliminary buffer layer. In one embodiment, the preliminary buffer layer is formed by spin-coating. In another embodiment, the preliminary buffer layer comprises a composition including about 2% to about 6% by weight of the water-soluble copolymer. In a further embodiment, the preliminary buffer layer comprises a composition including about 0.01% to about 1% by weight of a non-ionic polyoxyethylene surfactant and a remainder of an organic solvent. In still a further embodiment, the aqueous solution comprises at least one selected from the group consisting of water and an alcohol. In another aspect herein, the buffer layer pattern can be formed by cross-linking the water-soluble copolymers at a temperature of about 130° C. to about 210° C.

A method of forming a capacitor can also be provided. The method comprises forming a mold layer on a substrate having a conductive pattern, the mold layer having an opening to expose the conductive pattern, forming a conductive layer in the opening and on the mold layer, the conductive layer having a substantially uniform thickness, forming a buffer layer pattern on the conductive layer to fill the opening, the buffer layer pattern having a cross-linked structure of water-soluble copolymers including a repeating unit of N-vinyl-2-pyrrolidone and a repeating unit of acrylate, etching the conductive layer on the mold layer by using the buffer layer pattern as an etching mask to form a lower electrode on the substrate, removing the mold layer from the substrate, removing the buffer layer pattern to expose the lower electrode, forming a dielectric layer on the lower electrode, and forming an upper electrode on the dielectric layer.

Thus, the buffer layer pattern may have a relatively great etching resistance. Furthermore, after the buffer layer pattern is used as an etching mask for a conductive pattern, the buffer layer pattern may be removed through a developing process using a developing solution without performing a plasma ashing process. Thus, the method of forming a buffer layer pattern may simplify manufacturing processes for a capacitor and a semiconductor device, and may improve their efficiencies.

BRIEF DESCRIPTION OF THE DRAWINGS

The above and other features and advantages of the present invention will become more apparent by describing in detailed example embodiments thereof with reference to the accompanying drawings, in which:

FIG. 17 is a graph illustrating a thermal decomposition of a copolymer according to an example of the present invention.

DESCRIPTION OF THE EMBODIMENTS

Figure 1:
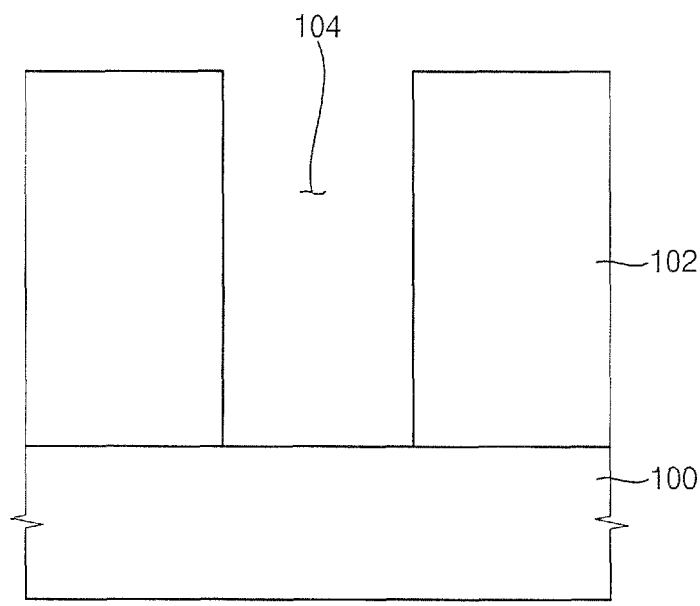
FIGS. 1 to 6 are cross-sectional views illustrating a method of forming a pattern according to example embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the Drawings. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations accordingly, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Method of Forming a Pattern

FIGS. 1 to 6 are cross-sectional views illustrating a method of forming a pattern according to example embodiments of the present invention.

Referring to FIG. 1, an insulation layer pattern 102 is formed on a substrate 100. The insulation layer pattern 102 has an opening 104 to expose a portion of an upper surface of the substrate 100.

For example, an insulation material may be deposited on the substrate 100 through a vapor deposition process to form an insulation layer. Examples of the substrate 100 may include a silicon substrate having an insulating interlayer and a contact pad passing through the insulating interlayer.

The insulation layer is patterned to form the insulation layer pattern 102. Examples of a material that may be used for the insulation layer may include borophosphosilicate glass (BPSG), phosphosilicate glass (PSG), undoped silicate glass (USG), spin-on glass (SOG), plasma-enhanced tetraethylorthosilicate (PE-TEOS) and the like.

In example embodiments, the insulation layer may have a thickness of about 5,000 Å to about 20,000 Å from the upper surface of the substrate 100. The thickness of the insulation layer may vary depending on a desired thickness of a conductive pattern since the thickness of the conductive pattern formed after the insulation layer depends on the thickness of the insulation layer.

Thereafter, a mask pattern (not shown) is formed on the insulation layer. The mask pattern includes a material having a high etching selectivity with respect to the insulation layer. Examples of the material may include silicon nitride, silicon oxide nitride and the like. The insulation layer exposed through the mask pattern is etched to expose the upper surface of the substrate 100.

For example, the insulation layer may be wet-etched using an LAL etching solution including deionized water, ammonium hydrofluoride, and hydrofluoric acid to form the insulation layer pattern 102. Alternatively, the insulation layer may be dry-etched using an etching gas including hydrofluoric acid anhydride, isopropyl alcohol and/or water vapor to form the insulation layer pattern 102. Prior to a formation of the insulation layer, an etch stop layer may be further formed on the substrate 100 to prevent damage of the substrate 100 when the insulation layer pattern 102 having the opening 104 is formed.

Figure 2:
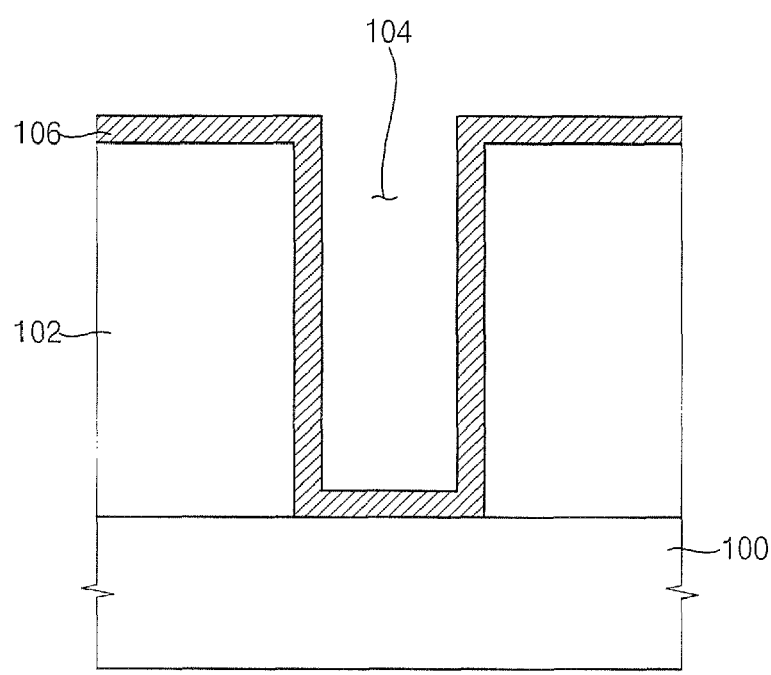

Referring to FIG. 2, a conductive layer 106 is formed on the insulation layer pattern 102 and in the opening 104.

For example, a conductive material may be deposited in the opening 104 and on the insulation layer pattern 102 through a vapor deposition process to form the conductive layer 106 having a substantially uniform thickness. Examples of the conductive material may include polysilicon, tungsten (W), titanium (Ti), titanium nitride (TiN), tungsten nitride (WN) and the like. These may be used alone or in combination thereof. When a single conductive material is used, the conductive layer 106 may have a single-layered structure. When a combination of the conductive materials is used, the conductive layer 106 may have a multiple-layered structure. In the example embodiment, the conductive layer 106 has a multiple-layered structure including a titanium layer and a titanium nitride layer that are sequentially deposited.

Figure 3:
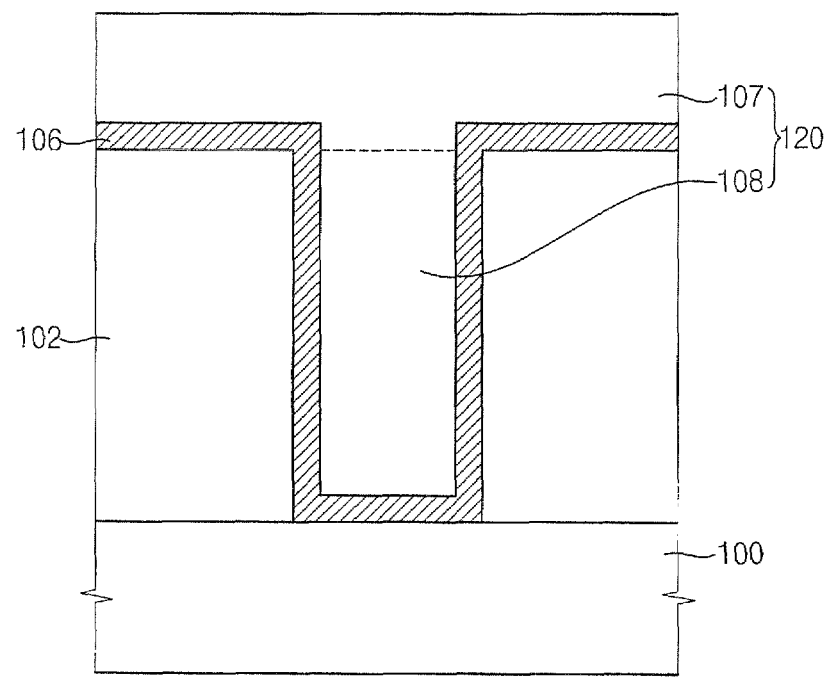

Referring to FIG. 3, a preliminary buffer layer 120 is formed to fill the opening 104 having the conductive layer 106 and to cover the conductive layer 106 on the insulation layer pattern 102.

The preliminary buffer layer 120 includes a water-soluble copolymer having a repeating unit of N-vinyl-2-pyrrolidone and a repeating unit of acrylate. The water-soluble copolymer may be represented by following Chemical Formula 1. The copolymers that are not cross-linked with each other are soluble in water.

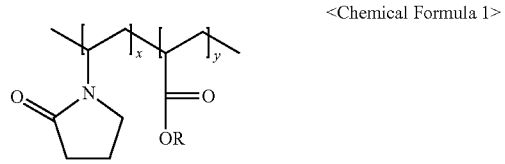

<Chemical Formula 1>

In Chemical Formula 1, R represents an alkyl group having carbon atoms of 1 to 5 or a methyl adamantyl group. Furthermore, a ratio of y:x may be about 1:1.8 to about 1:3.

When the number-average molecular weight of the water-soluble copolymer is more than about 15,000, the preliminary buffer layer 120 may not fill the opening sufficiently. When the number-average molecular weight of the water-soluble copolymer is less than about 7,000, an etching-resistance of a buffer layer pattern formed through a following process may be reduced. Thus, the number-average molecular weight of the water-soluble copolymer may be about 7,000 to about 15,000, and may be preferably about 10,000 to about 13,000. Furthermore, the glass-transition temperature of the water-soluble copolymer may be about 140° C. to about 145° C., and may be preferably may be about 142° C.

The molar ratio between the repeating unit of acrylate and the repeating unit of N-vinyl-2-pyrrolidone may be about 1:1.8 to about 1:3. For example, the water-soluble copolymer may have about 25% to about 35% by mole of the repeating unit of acrylate and about 65% to about 75% by mole of the repeating unit of N-vinyl-2-pyrrolidone.

The repeating unit of N-vinyl-2-pyrrolidone may allow the water-soluble copolymer to have hydrophilic characteristics. When the content of the repeating unit of N-vinyl-2-pyrrolidone is less than about 65% by mole, hydrophilic characteristics of the preliminary buffer layer 120 may be reduced. In contrast, when the content of the repeating unit of N-vinyl-2-pyrrolidone is more than about 75% by mole, the etching-resistance of the buffer layer pattern may be reduced. Thus, the water-soluble copolymer may include about 65% to about 75% by mole of the repeating unit of N-vinyl-2-pyrrolidone, and may preferably include about 68% to about 72% by mole of the repeating unit of N-vinyl-2-pyrrolidone.

The repeating unit of acrylate may allow the water-soluble copolymer to be soluble in an aqueous solution and to increase the etching-resistance of the buffer layer pattern. When the content of the repeating unit of acrylate is more than about 35% by mole, hydrophilic characteristics of the preliminary buffer layer 120 may be reduced. When the content of the repeating unit of acrylate is less than about 25% by mole, the etching-resistance of the buffer layer pattern may be reduced. Thus, the water-soluble copolymer may include about 25% to about 35% by mole of the repeating unit of acrylate, and may preferably include about 27% to about 32% by mole of the repeating unit of acrylate.

For example, a composition for forming a buffer layer may be coated on the substrate 100 by a spin coating method to form the preliminary buffer layer 120. The composition for a buffer layer may include about 2% to about 6% by weight of the water-soluble copolymer having the repeating unit of N-vinyl-2-pyrrolidone and the repeating unit acrylate, about 0.01% to about 1% by weight of a non-ionic polyoxyethylene surfactant and a remainder of an organic solvent. The water-soluble copolymer is preferably structurally described by the above Chemical Formula 1.

When the content of the water-soluble copolymer is more than about 6% by weight or less than about 2% by weight, the thickness of the buffer layer may not be uniform. Thus, the composition for a buffer layer may include about 2% to about 6% by weight of the water-soluble copolymer, and may preferably include about 2% to about 5% by weight of the water-soluble copolymer.

The non-ionic surfactant may preferably include a non-ionic polyoxyethylene surfactant. Examples of the non-ionic polyoxyethylene surfactant may include polyoxyethylene lauryl ether, polyoxyethylene cetyl ether, polyoxyethylene oleyl ether, polyoxyethylene sorbitan monolaurate, polyoxyethylene isooctylphenyl ether and the like. These may be used alone or in a combination thereof. Furthermore, examples of the non-ionic surfactant may include a conventional non-ionic surfactant known to those skilled in the art. Thus, any further explanation concerning the non-ionic surfactant will be omitted.

The organic solvent may control the viscosity of the composition so that the composition has characteristics suitable for a spin coating method. Examples of the organic solvent may include an alcohol. Furthermore, examples of the organic solvent may include an organic solvent soluble in water. Particularly, examples of the organic solvent may include methanol, ethanol, butanol, propanol, isopropyl alcohol, n-butanol, 1-methoxy-2-propanol, methoxypropylacetate, propylene glycol monomethylether acetate, propylene glycol monomethylether, isobutyl alcohol, t-butyl alcohol and the like. These may be used alone or in a combination thereof. Since the content of the organic solvent in the composition may vary such that the composition is capable of being coated through a spin coating method, the content of the organic solvent may not be limited to a specific range.

For example, the composition for a buffer layer may further include about 0.001% to about 0.01% by weight of the cross linking agent. Examples of the cross linking agent may include a melamine resin and the like. Furthermore, examples of the cross linking agent may include a conventional cross linking agent known to those skilled in the art. Thus, any further explanation concerning the cross linking agent will be omitted.

In an example embodiment, an etching rate or a dissolution rate of the buffer layer pattern may be controlled by adjusting the contents of the repeating unit of N-vinyl-2-pyrrolidone and the repeating unit of acrylate.

The preliminary buffer layer 120 may include an upper preliminary buffer layer 107 and a lower preliminary buffer layer 108. The upper preliminary buffer layer 107 may be removed through a developing process using a developing solution, and the lower preliminary buffer layer 108 may remain in the opening 104 after the developing process.

Figure 4:
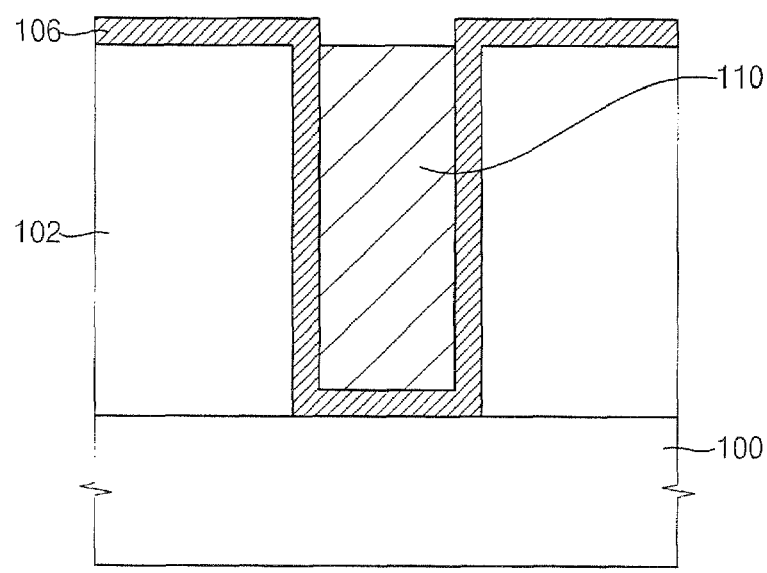

Referring to FIG. 4, an upper portion of the preliminary buffer layer 120 is removed through a cleaning process using an aqueous solution to form a preliminary buffer layer pattern disposed in the opening 104. The preliminary buffer layer pattern corresponds to the lower preliminary buffer layer 108. Since the preliminary buffer layer 120 includes the water-soluble copolymer, the upper preliminary buffer layer 107 may be readily removed by using an aqueous solution.

Examples of the aqueous solution may include water, an alcohol and the like. These may be used alone or in a combination thereof.

The preliminary buffer layer pattern is cured to cross-link the water-soluble copolymers in the preliminary buffer layer pattern so that the buffer layer pattern 110 is formed. For example, the preliminary buffer layer pattern in the opening 104 may be cured at a temperature of about 130° C. to about 210° C. to form the buffer layer pattern 110. The curing temperature may be about 1300° C. to about 210° C., and may be preferably about 140° C. to about 190° C. The buffer layer pattern 110 includes the water-soluble copolymers cross-linked with each other so that the buffer layer pattern 110 has an etching-resistance. Thus, damage to the conductive layer 106 disposed in the opening 104 may be prevented in the course of removing a portion of the conductive layer 106.

Furthermore, the buffer layer pattern 110 is not dissolved through a following cleaning process since the buffer layer pattern 110 is insoluble in an LAL solution, isopropyl alcohol, water and the like. Since the water-soluble copolymer cross-linked in the buffer layer pattern 110 is fully explained on the above, any further explanation concerning the water-soluble copolymer will be omitted.

Figure 5:
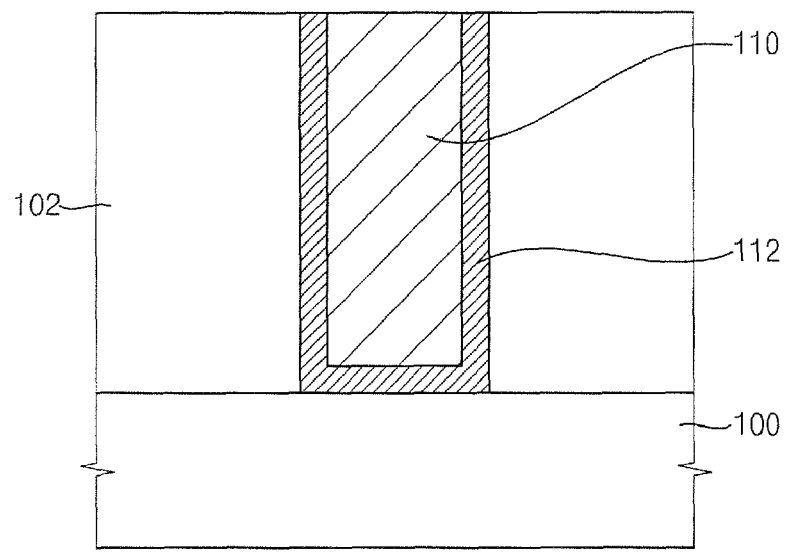

Referring to FIG. 5, the conductive layer 106 disposed on the upper surface of the insulation layer pattern 102 is etched by using the buffer layer pattern 110 as an etching mask.

For example, the conductive layer 106 disposed on the upper surface of the insulation layer pattern 102 is etched by using the buffer layer pattern 110 as a mask to expose the upper surface of the insulation layer pattern 102. Thus, a remaining conductive layer 106 forms a conductive layer pattern 112 having a cylindrical shape and making contact with an inner wall of the insulation layer pattern 102, which surrounds the opening 104. The buffer layer pattern 110 is insoluble in the developing solution. Thus, damage to the conductive layer pattern 112 may be prevented and or reduced when the conductive layer 106 is etched.

After the conductive layer pattern 112 is formed, a cleaning process may be further performed to remove an etching residue remaining on the insulation layer pattern 102 and the conductive layer pattern 112. For example, the cleaning process may be performed by using isopropyl alcohol, deionized water and the like.

Figure 6:
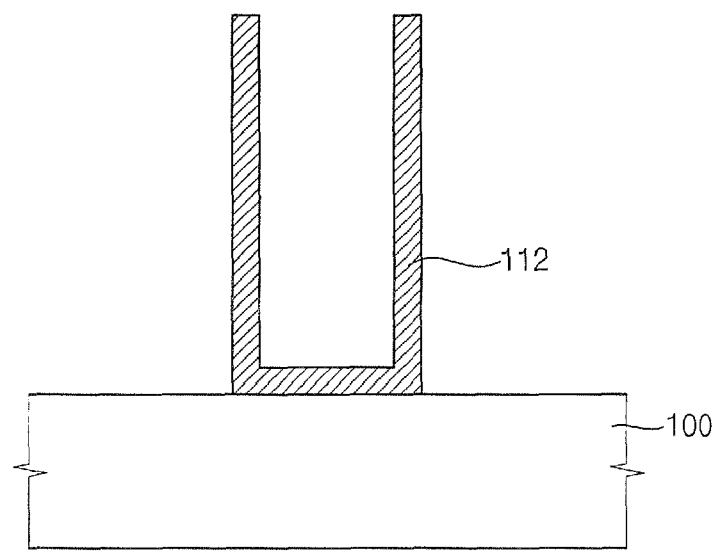

Referring to FIG. 6, the insulation layer pattern 102 on the substrate 100 and the buffer layer pattern 110 surrounded by the conductive layer pattern 112 are sequentially removed.

For example, the insulation layer pattern 102 is removed from the substrate 100 through a wet-etching process using an etching solution. When the insulation layer pattern 102 includes an oxide, the etching solution may be LAL solution including water, hydrofluoric acid and ammonium hydrofluoride.

Thereafter, the buffer layer pattern 110 surrounded by the conductive layer pattern 112 is removed through a developing process using a developing solution. Accordingly, the conductive layer pattern 112 disposed on the substrate 100 is completed, and a sidewall of the conductive layer pattern 112 is exposed. The developing solution may include hydroxyl tetramethylammonium to dissolve the buffer layer pattern 110. For example, the developing solution may an aqueous solution including about 2.4% by weight of hydroxyl tetramethylammonium and the remainder water.

The method of forming a pattern according to an example embodiment of the present invention may be variously used in a method of forming a cylindrical shaped pattern of a semiconductor device.

A method of manufacturing a capacitor of a semiconductor is described more fully hereinafter.

Method of Manufacturing a Capacitor

FIGS. 7 to 15 are cross-sectional views illustrating a method of manufacturing a capacitor according to an example embodiment of the present invention.

Figure 7:
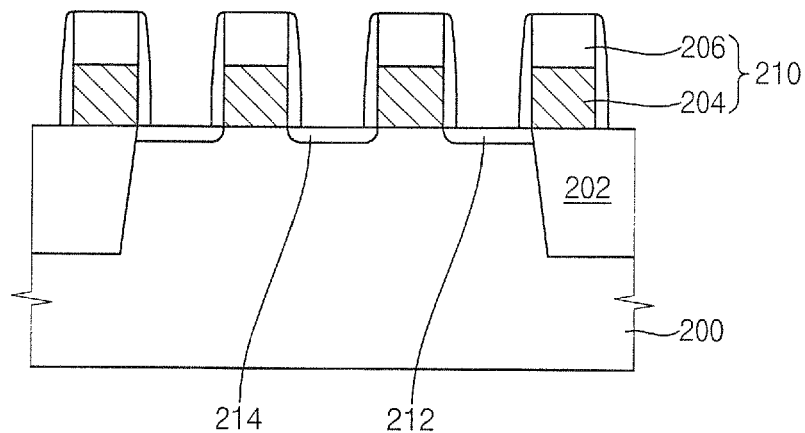
FIGS. 7 to 15 are cross-sectional views illustrating a method of manufacturing a capacitor according to example embodiments of the present invention.

Referring to FIG. 7, an isolation layer 202 is formed at an upper portion of a substrate 200, for example, a semiconductor substrate, through a shallow trench isolation (STI) process to divide the substrate 200 into an active region and a field region.

Thereafter, a gate insulation layer is formed on the substrate 200 having the isolation layer 202 through, for example, a heat oxidation process, a chemical vapor deposition (CVD) process, an atomic layer deposition process and the like. Examples of a material that may be used for the gate insulation layer may include silicon oxide (SiO2), a material having a dielectric constant substantially higher than that of silicon oxide and the like.

A first conductive layer and a gate mask 206 are sequentially formed on the gate insulation layer. The first conductive layer may include polysilicon doped with impurities. The first conductive layer may be patterned to form a gate electrode through the following processes. The first conductive layer may have a multi-layered structure including a doped polysilicon layer and a metal layer.

Figure 8:
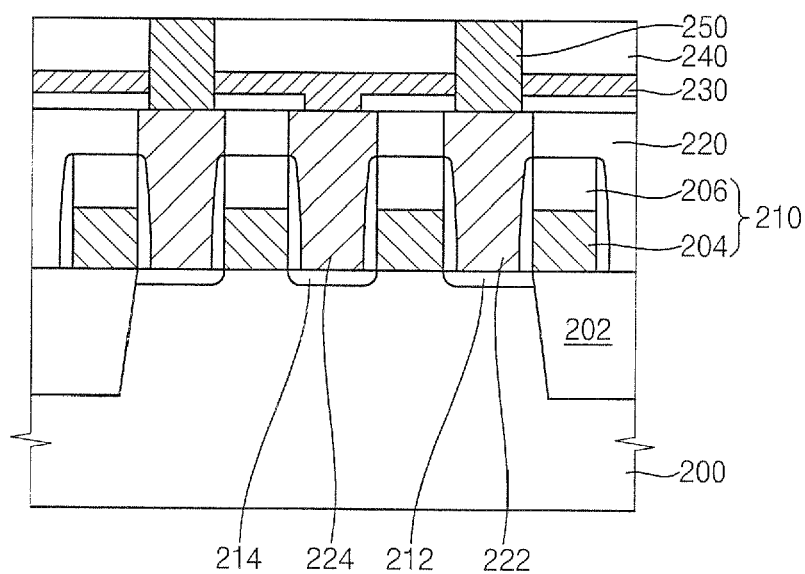

The gate mask 206 may include a material having a high etching selectivity with respect to a first insulating interlayer 220 (see FIG. 8). For example, when the first insulating interlayer 220 includes an oxide, such as silicon oxide, the gate mask 206 may include a nitride, such as silicon nitride.

Thereafter, the first conductive layer and the gate insulation layer are sequentially patterned by using the gate mask 206 as an etching mask. Thus, a plurality of gate structures 210, each of the gate structures 210 including a gate insulation layer pattern, a gate electrode 204 and the gate mask 206, is formed on the substrate 200.

Thereafter, a silicon nitride layer is formed on the substrate 200 having the gate structures 210, and then anisotropically etched to form a gate spacer at both sidewalls of each of the gate structures 210.

Impurities are implanted into the substrate 200 exposed between the gate structures 210 through an ion implantation process by using the gate structures 210 having the gate spacer as a mask. Thereafter, a first contact region 212 and a second contact region 214, which correspond to source/drain regions, are formed on the substrate 200 through a thermal treatment process. The first contact region 212 corresponds to a capacitor contact region making contact with a first pad 222, and the second contact region 214 corresponds to a bit line contact region making contact with a second pad 224.

Accordingly, a plurality of transistors, each of the transistors including the gate structure 210, the first contact region 212 and the second contact region 214, is formed on the substrate 200.

Referring to FIG. 8, a first insulating interlayer 220 is formed on the substrate 200. The first insulating interlayer 220 covers the transistor and includes an oxide. Examples of a material that may be used for the first insulating interlayer 220 may include BPSG, PSG, USG, SOG, PE-TEOS, high-density plasma chemical vapor deposition (HDP-CVD) oxide and the like. The first insulating interlayer 220 may be formed through a CVD process, a plasma-enhanced chemical vapor deposition (PECVD) process, a high-density plasma chemical vapor deposition (HDP-CVD) process, an atomic layer deposition process and the like.

Thereafter, an upper portion of the first insulating interlayer 220 is removed through a chemical mechanical polishing (CMP) process to planarize an upper surface of the first insulating interlayer 220. In an example embodiment, the first insulating interlayer 220 has a predetermined thickness from an upper surface of the gate mask 206.

A first photoresist pattern (not shown) is formed on the first insulating interlayer 220. Thereafter, the first insulating interlayer 220 is partially anisotropically etched by using the first photoresist pattern as an etching mask to form a plurality of first contact holes (not shown) through the first insulating interlayer 220. The first contact holes expose the first contact region 212 and the second contact region 214. A portion of the first contact holes exposes the first contact region 212 corresponding to the capacitor contact region. The remainder of the first contact holes exposes the second contact region 214 corresponding to the bit line contact region.

The first photoresist pattern is removed through an ashing process and/or a stripping process. A second conductive layer is formed to fill the first contact holes and to cover the first insulating interlayer 220. Examples of a material that may be used for the second conductive layer may include polysilicon doped with impurities of a high concentration, a metal, a conductive metal nitride and the like.

The second conductive layer is etched through a CMP process and/or an etch-back process to expose the upper surface of the first insulating interlayer 220. Thus, a first pad 222 and a second pad 224 are formed in the first contact holes. The first pad 222 is electrically connected to the capacitor contact region, and the second pad 224 is electrically connected to the bit line contact region.

A second insulating interlayer (not shown) is formed on the first insulating interlayer 220 having the first pad 222 and the second pad 224. The second insulating interlayer may serve to electrically separate the first pad 222 from a bit line formed through the following processes.

Thereafter, a CMP process is performed to planarize an upper portion of the second insulating interlayer. A second photoresist pattern (not shown) is formed on the planarized second insulating interlayer. The second insulating interlayer is partially etched by using the second photoresist pattern as an etching mask to form a second contact hole (not shown) through the second insulating interlayer. The second contact hole exposes the second pad 224. The second contact hole corresponds to a bit line contact hole for electrically connecting the second pad 224 to the bit line.

The second photoresist pattern is removed through an ashing process and/or a stripping process. A third conductive layer (not shown) is formed on the second insulating interlayer. The third conductive layer fills the second contact hole.

The third conductive layer is patterned to form a bit line 230 electrically connected to the second pad 224. The bit line 230 may include a first layer and a second layer. The first layer may include a metal and a metal oxide, and the second layer may include a metal. For example, the first layer may include titanium/titanium nitride (Ti/TiN), and the second layer may include tungsten (W).

Thereafter, a third insulating interlayer 240 is formed to cover the second insulating interlayer having the bit line 230. Examples of a material that may be used for the third insulating interlayer 240 may include BPSG, PSG, USG, SOG, PE-TEOS, HDP-CVD oxide, and the like.

A third photoresist pattern (not shown) is formed on the third insulating interlayer 240. The second insulating interlayer and the third insulating interlayer 240 are partially etched by using the third photoresist pattern as an etching mask to form a plurality of third contact holes (not shown)

exposing the first pad 222. A contact pad of a capacitor may be formed in each of the third contact holes.

A fourth conductive layer is formed on the third insulating interlayer 240. The fourth conductive layer fills the third contact holes. A CMP process is performed on the fourth conductive layer to form a third pad 250 in each of the third contact holes. Examples of a material that may be used for the third pad 250 may include polysilicon, into which impurities are doped. The third pad 250 may serve to connect the first pad 222 to a lower electrode formed through the following processes.

Figure 9:
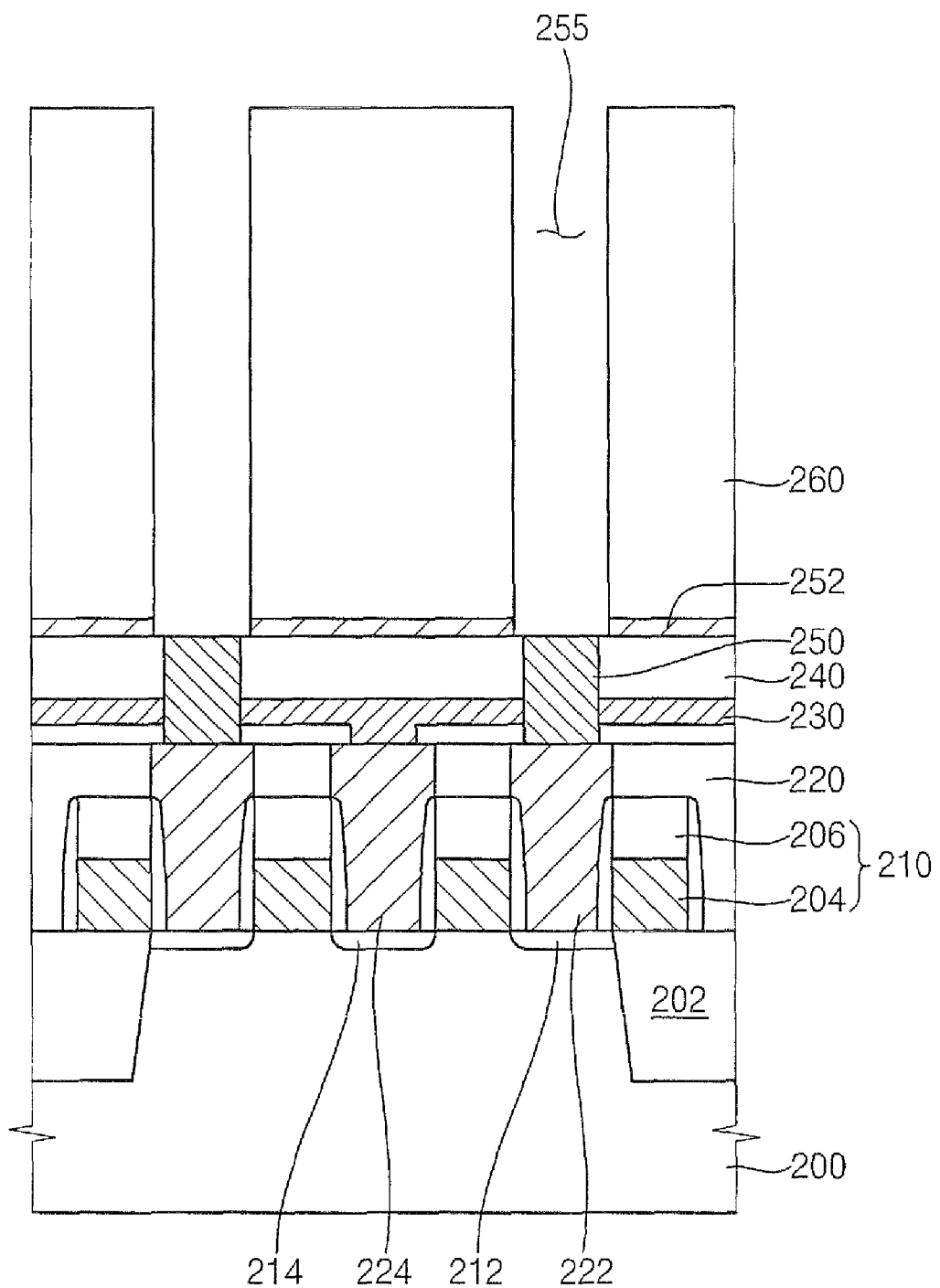

Referring to FIG. 9, an etch stop layer 252 is formed on the third pad 250 and on the third insulating interlayer 240. For example, the etch stop layer 252 may serve to protect the third pad 250 when a mold layer 260 is selectively etched through following processes to form an opening 255 through the mold layer 260. The thickness of the etch stop layer 252 may be about 10 Å to about 200 Å. The etch stop layer 252 may include a material having a low etching selectivity with respect to the mold layer 260, for example, a nitride, a metal oxide, and the like.

The mold layer 260 is formed on the etch stop layer 252. Examples of a material that may be used for the mold layer 260 may include silicon oxide. Particularly, examples of a material that may be used for the mold layer 260 may include BPSG, PSG, USG, SOG, TEOS, HDP-CVD oxide, and the like. The mold layer 260 may have a double-layered structure formed by depositing the materials. When the mold layer 260 have a double-layered structure including at least two layers having different etching ratios, a shape a sidewall of a lower electrode of a capacitor, which is formed through the following processes, may be changed.

The thickness of the mold layer 260 may vary depending on a desired capacitance of a capacitor. Since a height of a capacitor depends on the thickness of the mold layer 260, the thickness of the mold layer 260 may vary so as to form a capacitor having a desired capacitance.

Thereafter, the mold layer 260 and the etch stop layer 252 are partially etched to form an opening 255 to expose the third contact 250. When the opening 255 is formed, the etch stop layer 252 may be over-etched to entirely remove the etch stop layer 252 on a bottom of the opening 255. Thus, an upper portion of the third contact 250 may be partially etched when the etch stop layer 252 is etched.

Figure 10:
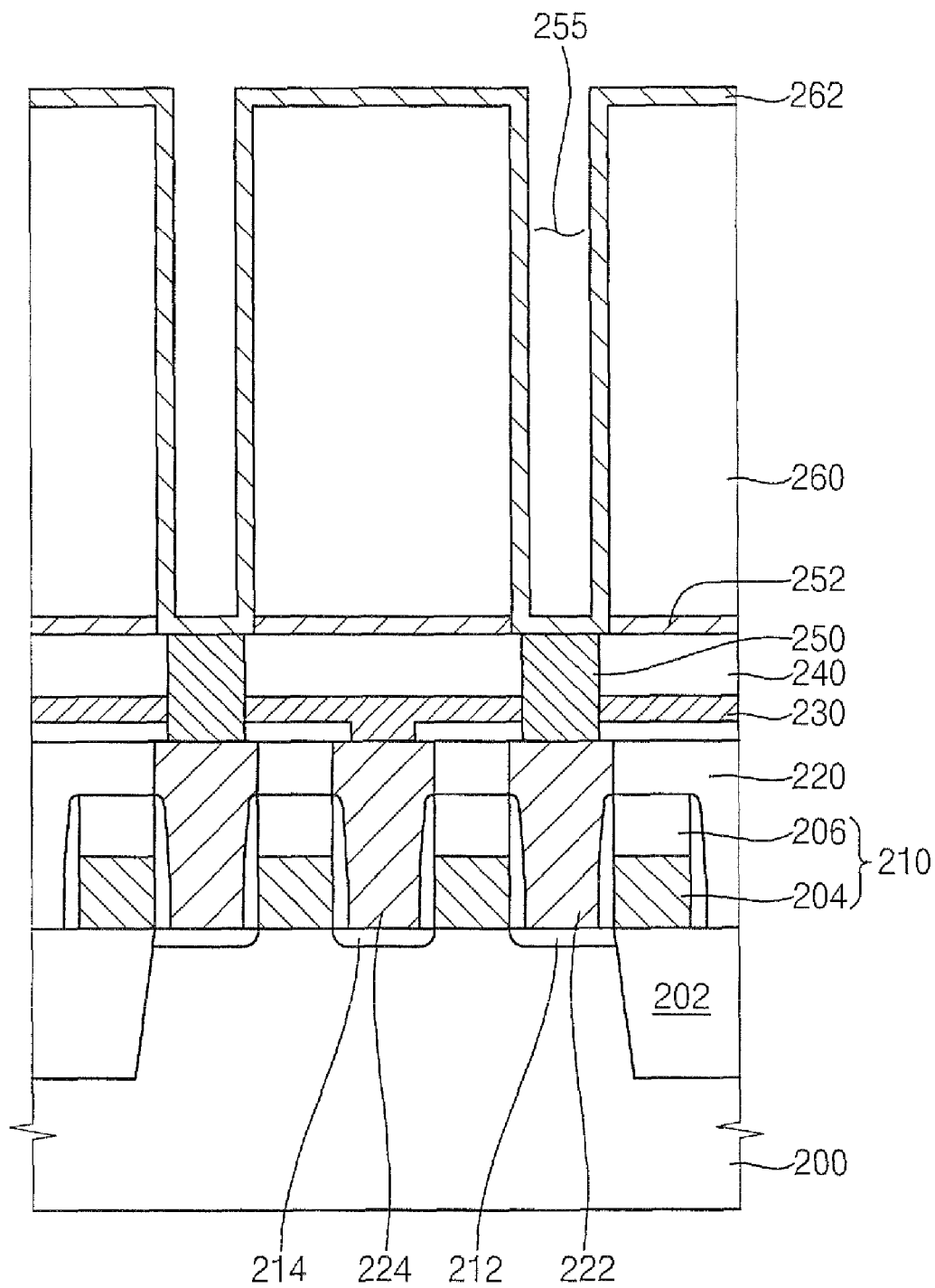

Referring to FIG. 10, a conductive layer 262 for forming a lower electrode is continuously formed at the sidewall and the bottom of the opening 255 and on the mold layer 260. The conductive layer 262 typically includes a material different from the third contact 250. For example, the conductive layer 262 may include a metal, a metal-containing material, or the like. Particularly, examples of a material that may be used for the conductive layer 262 may include titanium, titanium nitride, and the like. The conductive layer 262 may have a multiple-layered structure. For example, the conductive layer 262 may have a double-layered structure including a titanium layer and a titanium nitride layer.

As explained above, when the conductive layer 262 does not include polysilicon but includes a metal, a metal-containing material and the like, a depletion layer is generally not formed at an interface between a lower electrode and a dielectric layer, which can be formed through the following processes. Thus, a capacitance of a capacitor may be increased.

Since the conductive layer 262 is formed on an inner surface of the opening having a relatively higher aspect ratio, the conductive layer 262 may be preferably formed using a deposition method having relatively good step-coverage characteristics. The conductive layer 262 can has a relatively thin thickness which does not entirely fill the opening 255. Thus, the conductive layer 262 may be formed through, for example, a CVD process, a cyclic CVD process, an atomic layer deposition process, and the like.

Figure 11:
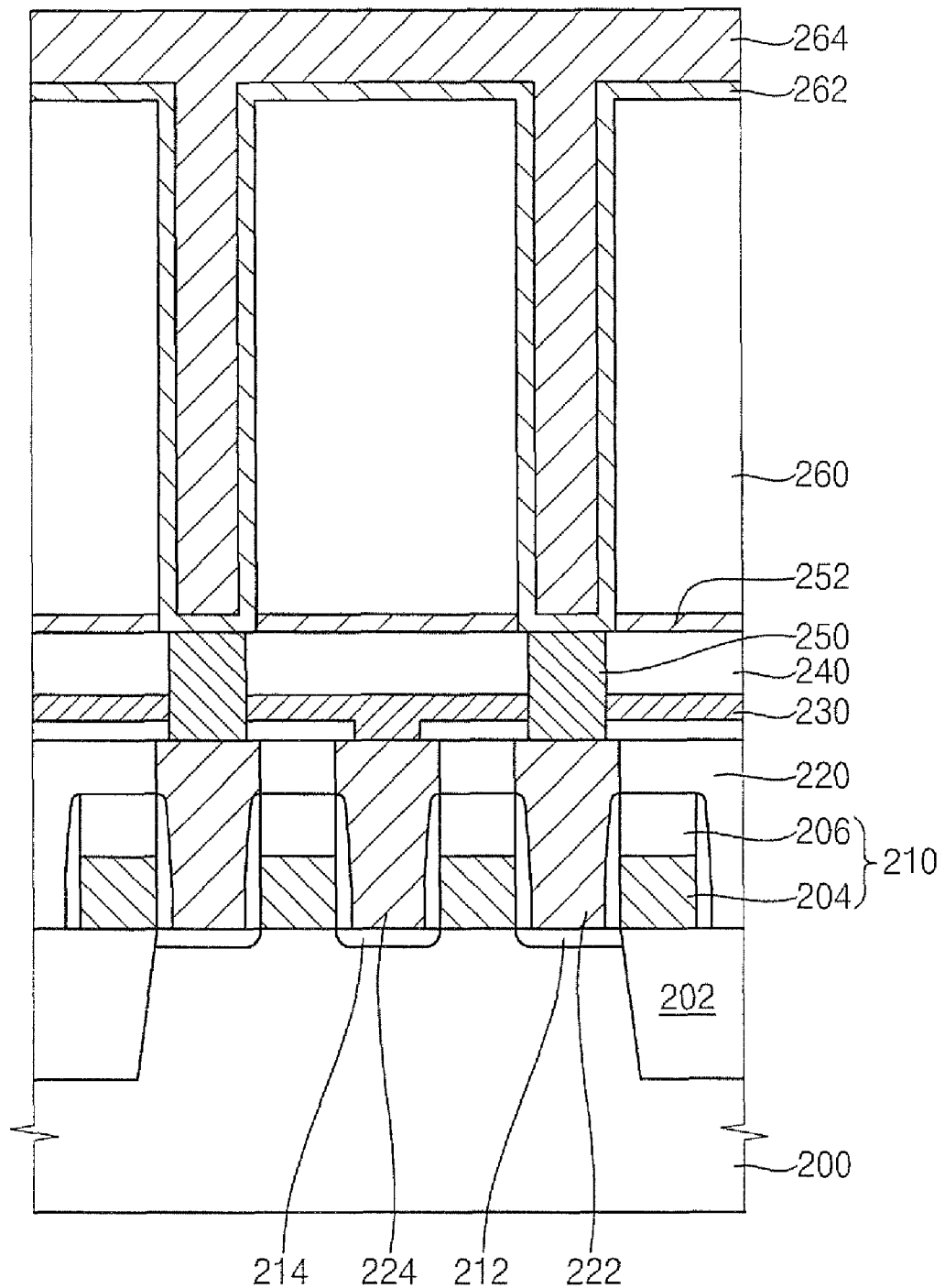

Referring to FIG. 11, the preliminary buffer layer 264 is formed to fill the opening 255 and to cover the conductive layer 262.

For example, the preliminary buffer layer 264 may be formed by coating a composition including about 2% to about 6% by weight of a water-soluble copolymer having the repeating unit of N-vinyl-2-pyrrolidone and the repeating unit of acrylate, about 0.01% to about 1% by weight of a non-ionic polyoxyethylene surfactant and a remainder of an organic solvent. Thus, the preliminary buffer layer 264 may include the water-soluble copolymer.

The water-soluble copolymer may be represented by above-described Chemical Formula 1. The number average molecular weight of the water-soluble copolymer may be about 7,000 to about 15,000. Furthermore, the water-soluble copolymer may include about 25% to about 35% by mole of the repeating unit of N-vinyl-2-pyrrolidone and about 65% to about 75% by mole of the repeating unit of acrylate. The water-soluble copolymer and the composition are substantially the same as the above-explained copolymer and the above-explained composition. Thus, any further explanation in these regards will be omitted.

The preliminary buffer layer 264 in the example embodiment includes a water-soluble copolymer. Thus, the preliminary buffer layer 264 may be removed through a cleaning process using an aqueous solution without performing an exposing process. Thus, a high-cost exposing device may be not required. Furthermore, when the buffer layer may be heated, the water-soluble copolymers can be cross-linked to form an insoluble buffer layer. The insoluble buffer layer is insoluble in water and isopropyl alcohol, which are used in a cleaning process and a drying process.

Figure 12:
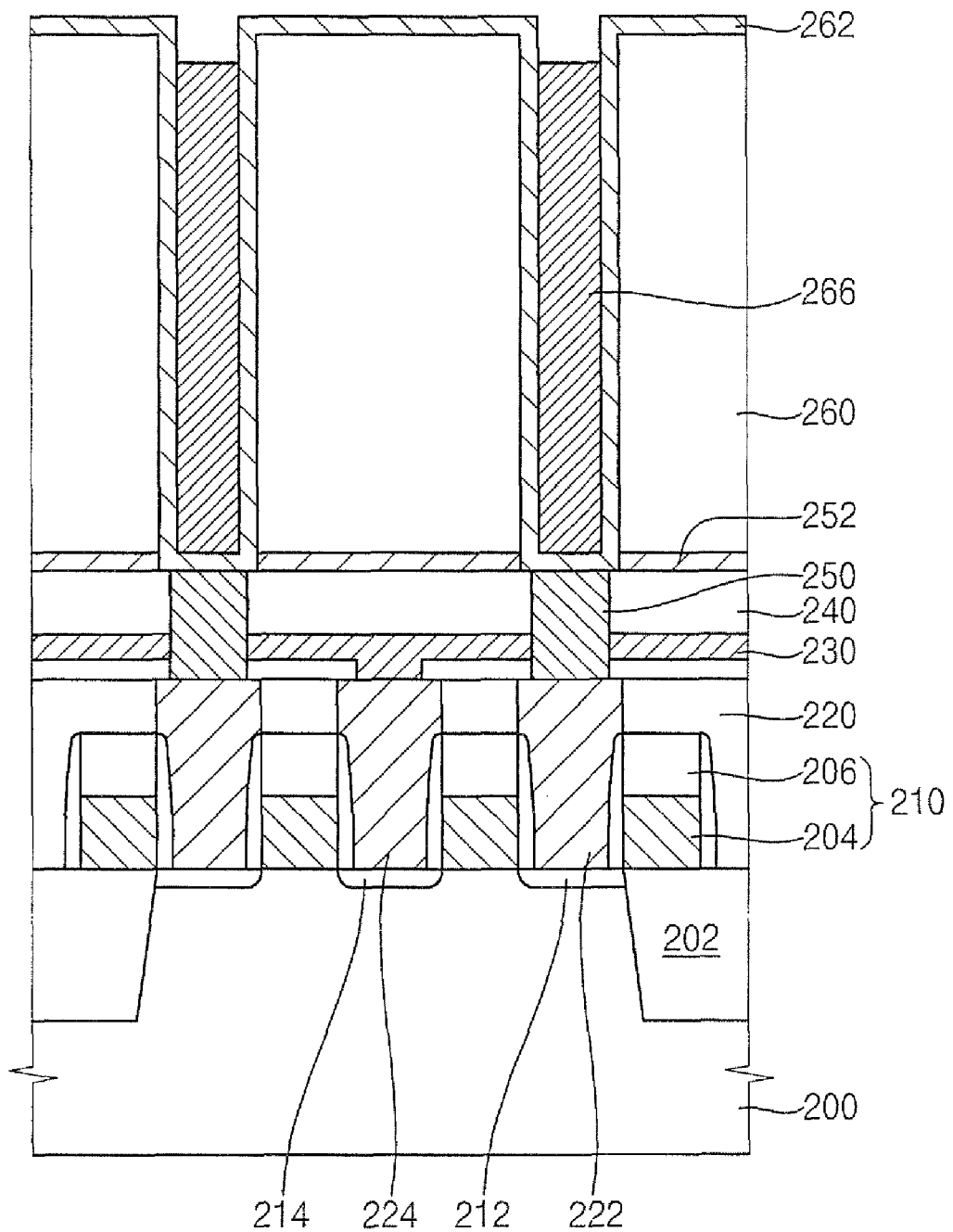

Referring to FIG. 12, an upper portion of the preliminary buffer layer 264 is removed through a cleaning process using an aqueous solution to form a preliminary buffer layer pattern in the opening 255. Examples of the aqueous solution may include water, an alcohol, and the like. These may be used alone or in a combination thereof.

Thereafter, the preliminary buffer layer pattern is cured. Thus, the water-soluble copolymers in the preliminary buffer layer pattern are cross-linked to form a buffer layer pattern 266 insoluble in an aqueous solution. For example, the preliminary buffer layer pattern may be cured to form the buffer layer pattern 266. The temperature may be preferably 130° C. to 210° C. and more preferably 140° C. to 190° C.

The buffer layer pattern 266 is not dissolved through a following cleaning process since the buffer layer pattern 266 may be insoluble in an LAL solution, isopropyl alcohol, water, and the like. The water-soluble copolymer is substantially the same as the above-explained water-soluble copolymer. Thus, any further explanation will be omitted.

Figure 13:
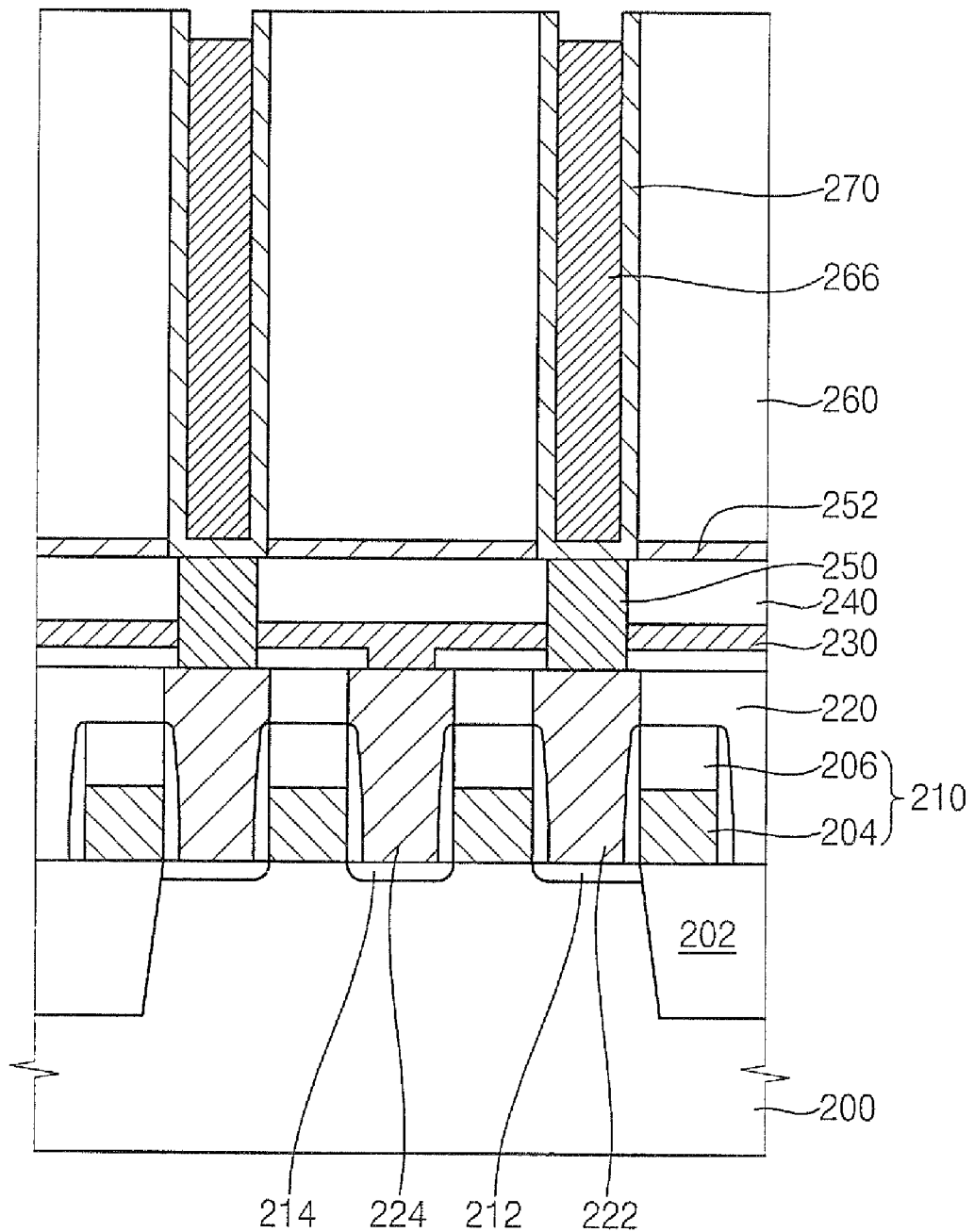

Referring to FIG. 13, the conductive layer 262 disposed on the mold layer 260 is removed to form a lower electrode 272.

For example, the conductive layer 262 is etched by using the buffer layer pattern 266 as an etching mask to expose an upper surface of the mold layer 260. Thus, the lower electrode 270 making contact with a sidewall surrounding the opening 255 and having a cylindrical shape is formed. The buffer layer pattern 266 remains in a cylinder of the lower electrode 270, and an outer sidewall of the lower electrode 270 is surrounded by the mold layer 260.

Figure 14:
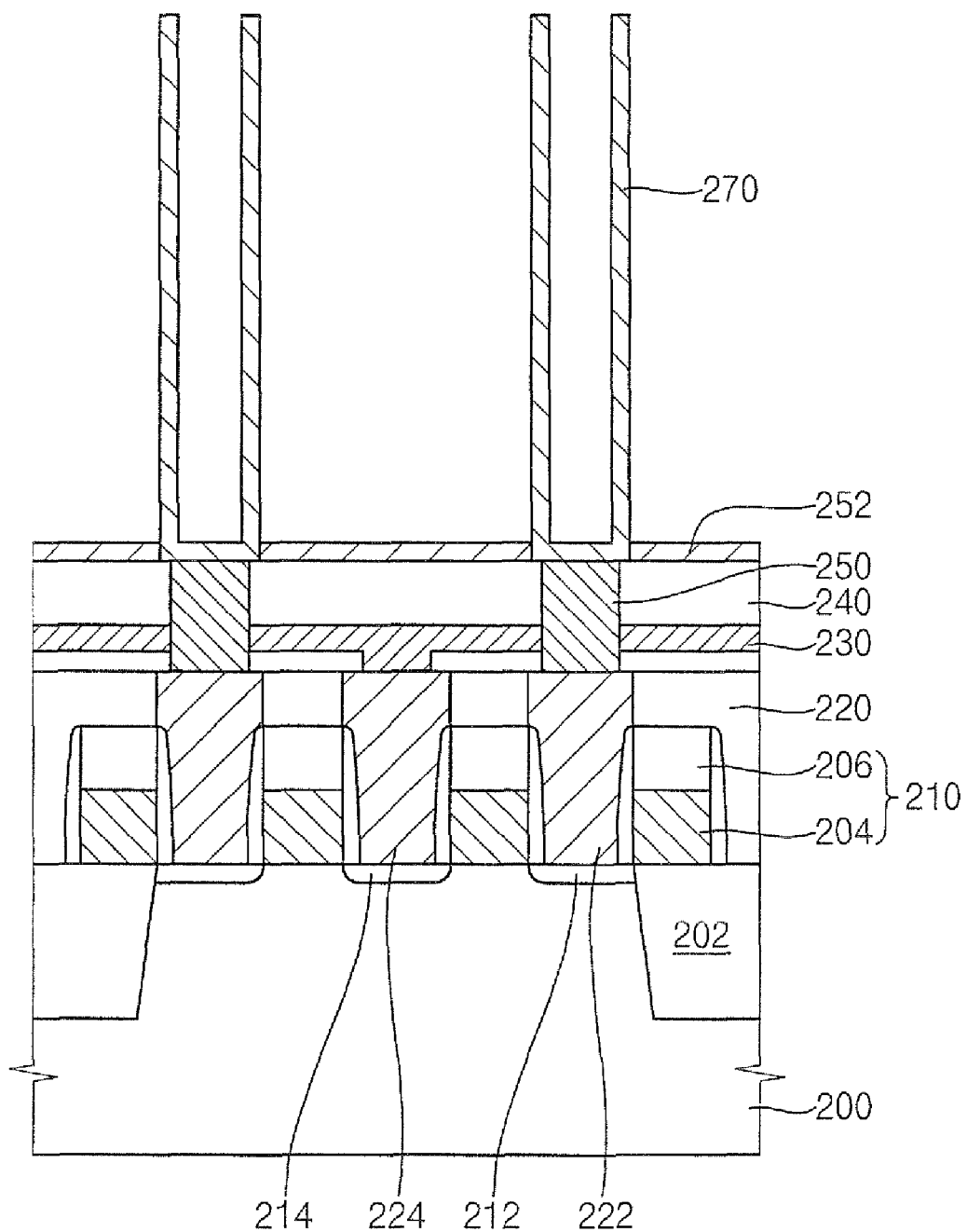

Referring to FIG. 14, the mold layer 260 is removed through a wet-etching process using an etching solution.

When the mold layer 260 includes silicon oxide, examples of the etching solution may include an LAL solution including water, hydrofluoric acid and ammonium hydrofluoride. The LAL solution may further include a metal corrosion inhibitor and a surfactant so as to prevent corrosion of the lower electrode and to prevent adsorption of an oxide.

Thereafter, the buffer layer pattern 266 is removed through a developing process using a developing solution. Since the buffer layer pattern 266 is soluble in the developing solution, the buffer layer pattern 266 may be easily removed through the developing solution. The developing solution may include hydroxyl tetramethylammonium and water.

Figure 15:
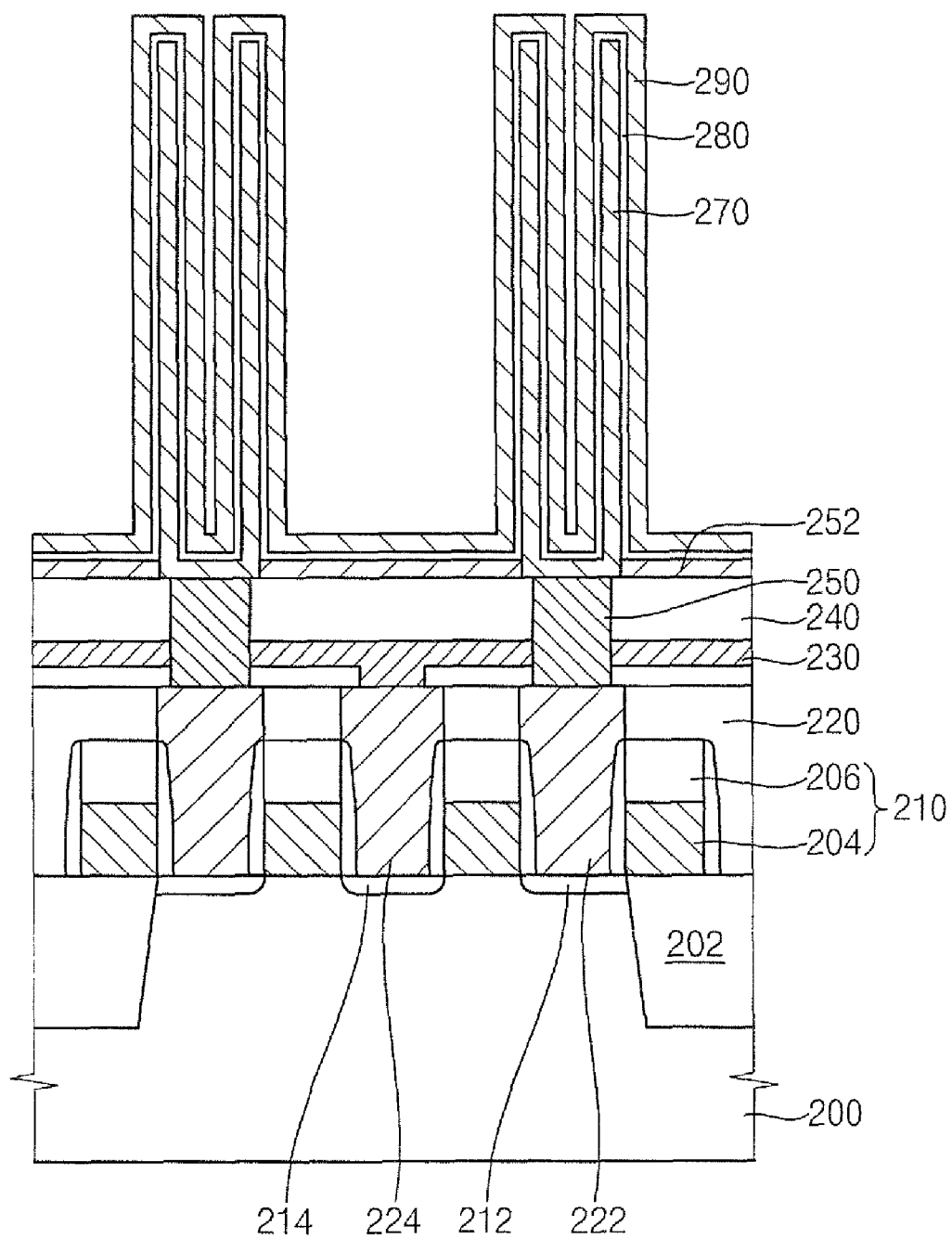

Referring to FIG. 15, a dielectric layer 280 having a uniform thickness is formed on the lower electrode 270. For example, a metal oxide having a relatively high dielectric constant may be deposited through a vapor deposition method to form the dielectric layer 280. Examples of the metal oxide may include aluminum oxide, hafnium oxide, and the like.

Thereafter, an upper electrode 290 is formed on the dielectric layer 280. The upper electrode 290 may include a metal, a material containing a metal and the like. Alternatively, after a metal or a material containing a metal is deposited to form a lower layer, polysilicon may be deposited on the lower layer to form the upper electrode 290 having a multiple-layered structure. A DRAM device is completed through the above-mentioned processes.

Example of Synthetic Polymer Preparation

A tetrahydrofuran (manufactured by Shiny Co., Taiwan) solvent was inserted into a 1,000 mL flask on which a reflux condenser and a stirrer were set. The tetrahydrofuran in the flask was stirred and the temperature was increased by about 80° C. N-vinyl-2-pyrrolidone and an acrylate compound having a methyl adamantyl group in a molar ratio of about 3:1 was inserted into the flask with the temperature maintained as above. The mixture was reacted for about 2 hours with the temperature maintained as above and the flask stirred to prepare a water-soluble copolymer that may be represented by following Chemical Formula 2. As a result of measuring the water-soluble polymer, using a gel permission chromatography (GPC) method, the polystyrene-reduced weight average molecular weight of the water-soluble polymer was determined to be about 20,000. Furthermore, the number average molecular weight of the water-soluble polymer was about 12,000, and the solid content of the water-soluble polymer was about 78% by weight (dried for about 3 hours at a temperature of about 150° C.). The content of the repeating unit of N-vinyl-2-pyrrolidone was about 68.8% by mole, and the content of the repeating unit of acrylate was about 31.2% by mole. In Chemical Formula 2, the ratio of m:n is about 1:1.8 to about 1:3.

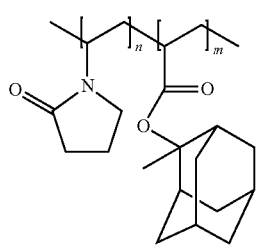

<Chemical Formula 2>

Evaluation of Glass-Transition Temperature of Copolymer

In order to evaluate the glass-transition temperature of the copolymer prepared in the above Example, the copolymer was cured at a temperature of about 120° C. and at about 130° C., respectively. The copolymer was thermal-analyzed through a differential scanning calorimeter (DSC) method. Thus results obtained are graphically illustrated in FIG. 16.

Figure 16:
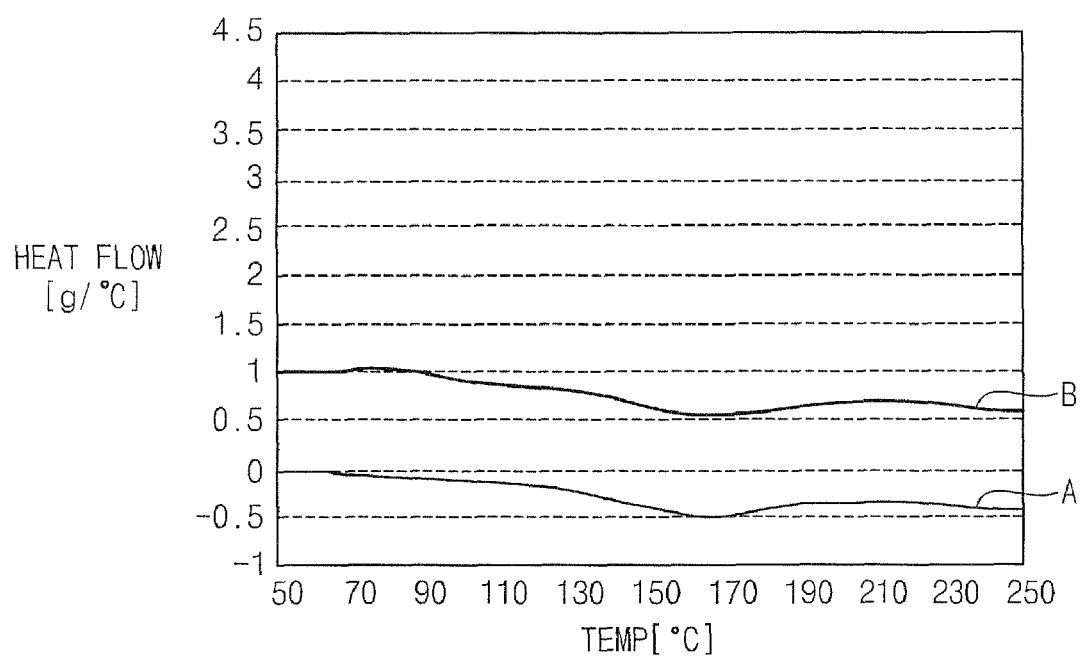
FIG. 16 is a graph illustrating thermal analysis of a copolymer used for forming a pattern according to example embodiments of the present invention.

Referring to FIG. 16, a radical change of slope appeared at a temperature of about 142° C. in a curve illustrating the copolymer cured at a temperature of about 120° C. Furthermore, a radical change of a slope appeared at a temperature of about 142° C. in a curve illustrating the copolymer cured at a temperature of about 130° C. Thus, it can be noted that the glass-transition temperature of the copolymer is about 142° C.

Evaluation of Heating Temperature of Copolymer

In order to evaluate the heating temperature of the copolymer in above Example, the copolymer was heated at seven different temperatures, and a heat discharging rate was measured. The results obtained are illustrated in FIG. 17.

Referring to FIG. 17, the copolymer was heated from a temperature of about 130° C. to about 160° C. It was suddenly discharged at a temperature of about 160° C. In contrast, the copolymer heated from a temperature of about 180° C. to about 190° C. was hardly discharged at a temperature of about 160° C. Thus, it can be noted that the copolymer may be preferably heated at a temperature of about 180° C. to about 190° C.

According to the above, the copolymer having a molecular weight of about 7,000 to about 15,000 and is cross-linked to form the buffer layer pattern. Thus, the buffer layer pattern may have a relatively great etching resistance. Furthermore, since the buffer layer pattern may be formed from a preliminary buffer layer through a cleaning process using an aqueous solution without performing exposing/developing processes using an exposing device, a high-cost exposing device may be not required.

Furthermore, after the buffer layer pattern is used as an etching mask for a conductive pattern, the buffer layer pattern may be removed through a developing process using a developing solution without performing a plasma ashing process. Thus, the method of forming a pattern may simplify manufacturing processes for a capacitor and a semiconductor device, and may improve their efficiencies.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a conductive pattern on a substrate, comprising:

forming a mold layer having an opening on said substrate;

forming a conductive layer on the mold layer and in the opening, the conductive layer having a substantially uniform thickness;

forming a buffer layer pattern to fill the opening having the conductive layer, the buffer layer pattern having a cross-linked structure of water-soluble copolymers including a repeating unit of N-vinyl-2-pyrrolidone and a repeating unit of an acrylate; and etching an upper portion of the conductive layer exposed over the buffer layer pattern to form said conductive pattern on the substrate, wherein the water-soluble copolymer has a number average molecular weight of about 7,000 to about 15,000.

2. The method of claim 1, wherein the water-soluble copolymer includes about 25% to about 35% by mole of the repeating unit of acrylate and about 65% to about 75% by mole of the repeating unit of N-vinyl-2-pyrrolidone.

3. The method of claim 1, wherein the water-soluble copolymer is represented by following Chemical Formula 1, and wherein R is an alkyl group having from 1 to 5 carbon atoms or a methyl adamantyl group, and a ratio of y:x which is from about 1:1.8 to about 1:3.

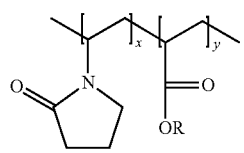

<Chemical Formula 1>

4. The method of claim 1, wherein forming a buffer layer pattern comprises:
   forming a preliminary buffer layer filling the opening having the conductive layer, the preliminary buffer layer covering the conductive layer on the mold layer;
   removing an upper portion of the preliminary buffer layer by using an aqueous solution; and
   curing the preliminary buffer layer.

5. The method of claim 4, wherein the preliminary buffer layer is formed by spin-coating.

6. The method of claim 5, wherein the preliminary buffer layer comprises a composition including about 2% to about 6% by weight of the water-soluble copolymer.

7. The method of claim 5, wherein the preliminary buffer layer comprises a composition including about 0.01% to about 1% by weight of a non-ionic polyoxyethylene surfactant and a remainder of an organic solvent.

8. The method of claim 4, wherein the aqueous solution comprises at least one selected from the group consisting of water and an alcohol.

9. The method of claim 1, wherein the buffer layer pattern is formed by cross-linking the water-soluble copolymers at a temperature of about 130° C. to about 210° C.

10. A method of forming a capacitor, the method comprising:
    forming a mold layer on a substrate having a conductive pattern, the mold layer having an opening to expose the conductive pattern;
    forming a conductive layer in the opening and on the mold layer, the conductive layer having a substantially uniform thickness;
    forming a buffer layer pattern on the conductive layer to fill the opening, the buffer layer pattern having a cross-linked structure of water-soluble copolymers including a repeating unit of N-vinyl-2-pyrrolidone and a repeating unit of acrylate;
    etching the conductive layer on the mold layer by using the buffer layer pattern as an etching mask to form a lower electrode on the substrate;
    removing the mold layer from the substrate;
    removing the buffer layer pattern to expose the lower electrode;
    forming a dielectric layer on the lower electrode; and
    forming an upper electrode on the dielectric layer, wherein the water-soluble copolymer has a number average molecular weight of about 7,000 to about 15,000.

11. The method of claim 10, wherein the water-soluble copolymer includes about 25% to about 35% by mole of the repeating unit of acrylate and about 65% to about 75% by mole of the repeating unit of N-vinyl-2-pyrrolidone.

12. The method of claim 10, wherein the water-soluble copolymer is represented by following Chemical Formula 1, and wherein R is an alkyl group having from 1 to 5 carbon atoms or a methyl adamantyl group, and a ratio of y:x which is from about 1:1.8 to about 1:3.

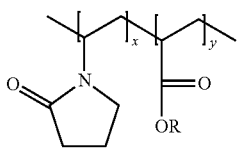

<Chemical Formula 1>

13. The method of claim 10, wherein forming a buffer layer pattern comprises:
    forming a preliminary buffer layer filling the opening having the conductive layer, the preliminary buffer layer covering the conductive layer on the mold layer;
    removing an upper portion of the preliminary buffer layer by using an aqueous solution; and
    curing the preliminary buffer layer.

14. The method of claim 13, wherein the preliminary buffer layer is formed by spin-coating.

15. The method of claim 14, wherein the preliminary buffer layer comprises a composition including about 2% to about 6% by weight of the water-soluble copolymer.

16. The method of claim 14, wherein the preliminary buffer layer comprises a composition including about 0.01% to about 1% by weight of a non-ionic polyoxyethylene surfactant and a remainder of an organic solvent.

17. The method of claim 13, wherein the aqueous solution comprises at least one selected from the group consisting of water and an alcohol.

18. The method of claim 10, wherein the buffer layer pattern is formed by cross-linking the water-soluble copolymers at a temperature of about 130° C. to about 210° C.

* * * * *